(12) United States Patent
Shin (10) Patent No.: US 10,497,447 B2
(45) Date of Patent: Dec. 3, 2019

(54) MEMORY DEVICE CAPABLE OF SUPPORTING MULTIPLE READ OPERATIONS

(71) Applicant: SK hynix Inc., Gyeonggi-do (KR)

(72) Inventor: Kye-Wan Shin, Pleasanton, CA (US)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 15/989,460

(22) Filed: May 25, 2018

(65) Prior Publication Data

US 2019/0006012 A1    Jan. 3, 2019

Related U.S. Application Data

(60) Provisional application No. 62/526,637, filed on Jun. 29, 2017.

(51) Int. Cl.
| | | |
|---|---|---|
| G11C 16/26 | (2006.01) | |
| G11C 16/30 | (2006.01) | |
| G11C 16/04 | (2006.01) | |
| G11C 16/08 | (2006.01) | |
| G11C 16/32 | (2006.01) | |
| G06F 3/06  | (2006.01) | |

(52) U.S. Cl.
CPC .......... *G11C 16/26* (2013.01); *G11C 16/0483* (2013.01); *G11C 16/08* (2013.01); *G11C 16/30* (2013.01); *G06F 3/061* (2013.01); *G06F 3/0659* (2013.01); *G06F 3/0679* (2013.01); *G11C 16/32* (2013.01)

(58) Field of Classification Search
CPC ................................ G11C 16/10; G11C 16/26

USPC ........................................ 365/185.11, 185.24
See application file for complete search history.

(56) References Cited

U.S. PATENT DOCUMENTS

| | | | | |
|---|---|---|---|---|
| 4,884,191 A  * | 11/1989 | Weatherford | ............ | G11C 8/12 |
| | | | | 711/106 |
| 5,544,306 A  * | 8/1996 | Deering | ................ | G06T 15/405 |
| | | | | 345/531 |
| 5,583,791 A  * | 12/1996 | Harigaya | ............. | G11B 27/107 |
| | | | | 348/575 |
| 8,347,042 B2 * | 1/2013 | You | ........................ | G11C 16/26 |
| | | | | 365/185.18 |
| 8,508,998 B2 * | 8/2013 | Haukness | ........... | G06F 12/0246 |
| | | | | 365/185.11 |
| 8,775,997 B2 * | 7/2014 | Diamond | ............... | G06F 11/267 |
| | | | | 716/116 |
| 9,082,512 B1 * | 7/2015 | Davis | .................. | G06F 11/1048 |
| 9,299,848 B2 * | 3/2016 | Kato | .................... | H01L 29/7869 |
| 9,659,638 B1 * | 5/2017 | Shin | ..................... | G11C 11/5642 |
| 9,703,629 B2 * | 7/2017 | Desireddi | ........... | G06F 11/1068 |
| 9,710,377 B1 | 7/2017 | Kuzmin et al. | | |
| 9,869,716 B2 * | 1/2018 | Kurokawa | ......... | G01R 31/2884 |
| 2005/0144361 A1* | 6/2005 | Gonzalez | ............ | G06F 12/0246 |
| | | | | 711/103 |

(Continued)

*Primary Examiner* — Michael T Tran
(74) *Attorney, Agent, or Firm* — IP & T Group LLP (57) ABSTRACT

A memory device includes: memory cells of first and second planes; and a control circuit suitable for performing multiple read operations on the memory cells in response to a read command. The multiple read operations may include a first read operation which is performed on the memory cells of the first plane in a first read period and a second read operation which is performed on the memory cells of the second plane in a second read period.

19 Claims, 10 Drawing Sheets

(56) References Cited

U.S. PATENT DOCUMENTS

| | | | |
|---|---|---|---|
| 2007/0076484 A1* | 4/2007 | Cho | G11C 16/0483 365/185.21 |
| 2008/0181032 A1* | 7/2008 | Yu | G11C 11/5642 365/194 |
| 2008/0258129 A1* | 10/2008 | Toda | G11C 11/56 257/5 |
| 2008/0294813 A1* | 11/2008 | Gorobets | G06F 12/0246 710/62 |
| 2008/0294814 A1* | 11/2008 | Gorobets | G11C 16/349 710/62 |
| 2009/0157964 A1* | 6/2009 | Kasorla | G06F 12/0246 711/118 |
| 2011/0161784 A1* | 6/2011 | Selinger | G06F 11/1068 714/768 |
| 2012/0236628 A1* | 9/2012 | Ikeda | G11C 13/0007 365/148 |
| 2012/0320672 A1* | 12/2012 | Meir | G11C 11/4091 365/185.03 |
| 2013/0128675 A1* | 5/2013 | Kim | G11C 7/10 365/189.05 |
| 2014/0056055 A1* | 2/2014 | Ikeda | G11C 13/00 365/148 |
| 2014/0226402 A1* | 8/2014 | Duzly | G11C 16/10 365/185.11 |
| 2014/0258596 A1* | 9/2014 | Kojima | G06F 12/0246 711/103 |
| 2014/0289559 A1* | 9/2014 | Hashimoto | G11C 29/08 714/27 |
| 2015/0003151 A1* | 1/2015 | Lee | G11C 16/10 365/185.02 |
| 2015/0357357 A1* | 12/2015 | Sargent | H04N 5/378 250/208.1 |
| 2016/0027504 A1* | 1/2016 | Lee | G11C 11/5635 365/185.03 |
| 2016/0070507 A1* | 3/2016 | Hoshikawa | G06F 12/0246 711/149 |
| 2016/0071605 A1* | 3/2016 | Moschiano | G11C 16/26 365/185.12 |
| 2016/0110126 A1* | 4/2016 | Lee | G11C 11/5628 711/103 |
| 2016/0188210 A1* | 6/2016 | Tanzawa | G06F 3/0604 711/154 |
| 2016/0372209 A1* | 12/2016 | Matsunaga | G11C 16/3404 |
| 2017/0075574 A1* | 3/2017 | Oikawa | G06F 3/061 |
| 2017/0131904 A1* | 5/2017 | Rajwade | G06F 3/0604 |
| 2017/0285938 A1* | 10/2017 | Lee | G06F 3/061 |
| 2017/0301404 A1* | 10/2017 | Yim | G11C 16/3418 |
| 2017/0309338 A1 | 10/2017 | Shah et al. | |
| 2017/0365335 A1* | 12/2017 | Wang | G11C 16/0483 |
| 2018/0040370 A1* | 2/2018 | Tortorelli | G11C 11/5678 |
| 2018/0225164 A1* | 8/2018 | Khoueir | G06F 11/1072 |
| 2018/0277218 A1* | 9/2018 | Shimizu | G11C 11/5642 |
| 2019/0156894 A1* | 5/2019 | Park | G11C 16/10 |
| 2019/0221271 A1* | 7/2019 | Sudo | G11C 16/26 |

* cited by examiner

MEMORY DEVICE CAPABLE OF SUPPORTING MULTIPLE READ OPERATIONS

CROSS-REFERENCE TO RELATED APPLICATION

This application claims priority to U.S. Provisional Patent Application No. 62/526,637 entitled, "FAST SLC WITH MULTIPLE tR FEATURE," filed on Jun. 29, 2017, which is incorporated herein by reference in its entirety.

BACKGROUND

1. Field

Various embodiments of the invention relates generally to a memory device and, more particularly, to a memory device capable of performing read operations.

2. Discussion of the Related Art

Electronic devices such as computers, mobile phones and storage devices may include integrated circuits (ICs) having various elements or circuits integrated therein. Each of the integrated circuits may be coupled to one or more external circuits or devices and may include components for interfacing the external circuits or devices. For example, a device such as a memory device may be coupled to a memory controller, constituting a memory system.

In general, various signals such as data, addresses and commands may be transmitted or received between the memory device and the memory controller in the memory system. Therefore, various operations, such as program, read and erase operations, involved to transmit or receive the various signals may be performed on the memory device by the memory controller.

SUMMARY

Various embodiments are directed to a memory device capable of supporting multiple read operations.

In an embodiment, a memory device may include: at least one first memory cell of first plane; at least one second memory cell of second plane; and a control circuit suitable for performing multiple read operations on the at least one first memory cell and the at least one second memory cell in response to a read command. The multiple read operations may include a first read operation which is performed on the at least one first memory cell in a first read period and a second read operation which is performed on the at least one second memory cell in a second read period.

In an embodiment, a memory device may include: a plurality of memory planes; and a control circuit suitable for controlling plural read operations to be performed on different memory planes in different speeds in response to a read command.

These and other features and advantages of the invention will become apparent to those with ordinary skill in the art to which the invention belongs from the following description in conjunction with the accompanying drawings.

DETAILED DESCRIPTION

Various embodiments of the invention will be described below in more detail with reference to the accompanying drawings. It is noted, however, that the invention may be embodied in different forms and should not be construed as limited to the embodiments set forth herein. Rather, these embodiments are provided so that this disclosure will be thorough and complete, and will fully convey the scope of the invention to those skilled in the art to which the invention pertains. Throughout the disclosure, like reference numerals refer to like parts throughout the various figures and embodiments of the invention.

Moreover, it is noted that the terminology used herein is for describing the examples only and is not intended to be limiting of the invention. As used herein, singular forms are intended to include the plural forms as well, unless the context clearly indicates otherwise. It will be further understood that the terms "comprises," "comprising," "includes" and/or "including" when used in this specification, indicate the presence of stated features, but do not preclude the presence or addition of one or more other non-stated features.

In the following description, numerous specific details are set forth in order to provide a thorough understanding of the present invention. The invention may be practiced without some or all these specific details. In other instances, well-known process structures and/or processes have not been described in detail in order not to unnecessarily obscure present invention.

It is also noted, that in some instances, as would be apparent to those skilled in the art to which the invention pertains, a feature or element described in connection with one embodiment may be used singly or in combination with other features or elements of another embodiment, unless otherwise specifically indicated.

Figure 1A:
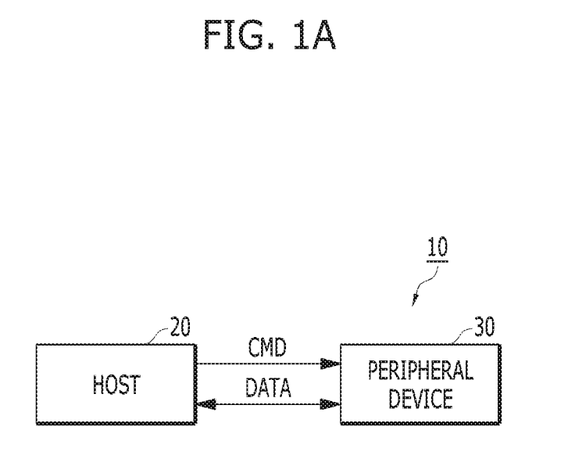
FIGS. 1A and 1B are simplified block diagrams of a data processing system.
Figure 1B:
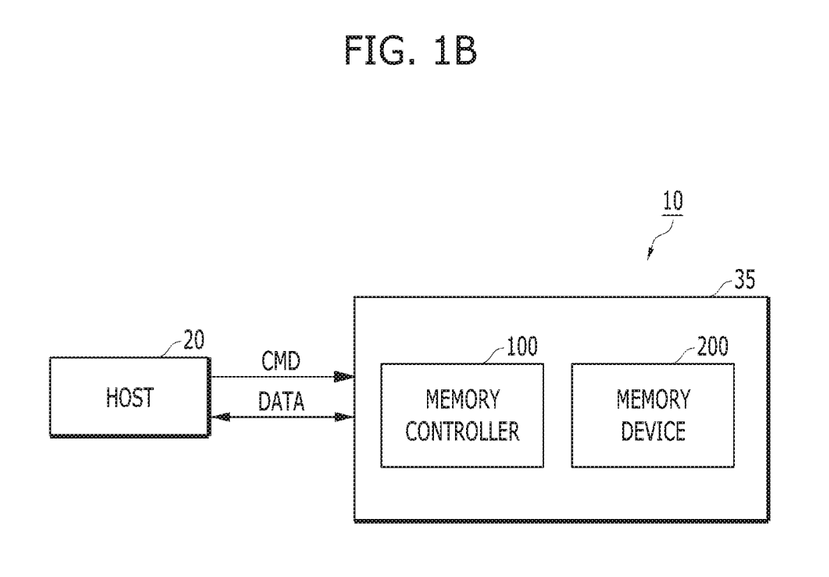

FIGS. 1A and 1B illustrate a data processing system.

Referring to FIG. 1A, the data processing system 10 may include a host 20 and a peripheral device 30. The peripheral device 30 may receive a command CMD (or request) from the host 20, and exchange data DATA with the host 20 according to the received command. By the way of example but not limitation, the host 20 may be any suitable electronic device including a computer, a server, a smart phone and the like, and the peripheral device 30 may include a mobile device or a storage product.

Referring to FIG. 1B, the peripheral device 30 illustrated in FIG. 1A may be implemented with a memory system 35. That is, the data processing system 10 may include the host 20 and the memory system 35. The host 20 may include portable electronic devices such as a mobile phone, MP3 player and laptop computer, or non-portable electronic devices such as a desktop computer, game machine, TV and projector.

Data stored in the memory system 35 may be accessed in response to a command inputted from the host 20. The memory system 35 may be used as a main memory device or auxiliary memory device of the host 20.

The memory system 35 may include a memory controller 100 and a memory device 200. The memory controller 100 may perform an access operation on the memory device 200 in response to a command received from the host 20. For example, the memory controller 100 may store a write data from the host 20 in the memory device 200 in response to a write command received from the host 20. For another example, the memory controller 100 may read a data stored in the memory device 200 in response to a read command received from the host 20, and may transfer the accessed data (read data) to the host 20. In various examples, the memory device 200 may be or include volatile memory devices such as a dynamic random access memory (DRAM) and a static RAM (SRAM). In other examples, the memory device 200 may be or include one of various types of nonvolatile memory devices such as a read only memory (ROM), a mask ROM (MROM), a programmable ROM (PROM), an erasable ROM (EPROM), an electrically erasable ROM (EEPROM), a ferromagnetic ROM (FRAM), a phase change RAM (PRAM), a magnetic RAM (MRAM), a resistive RAM (RRAM), and a flash memory.

Figure 2:
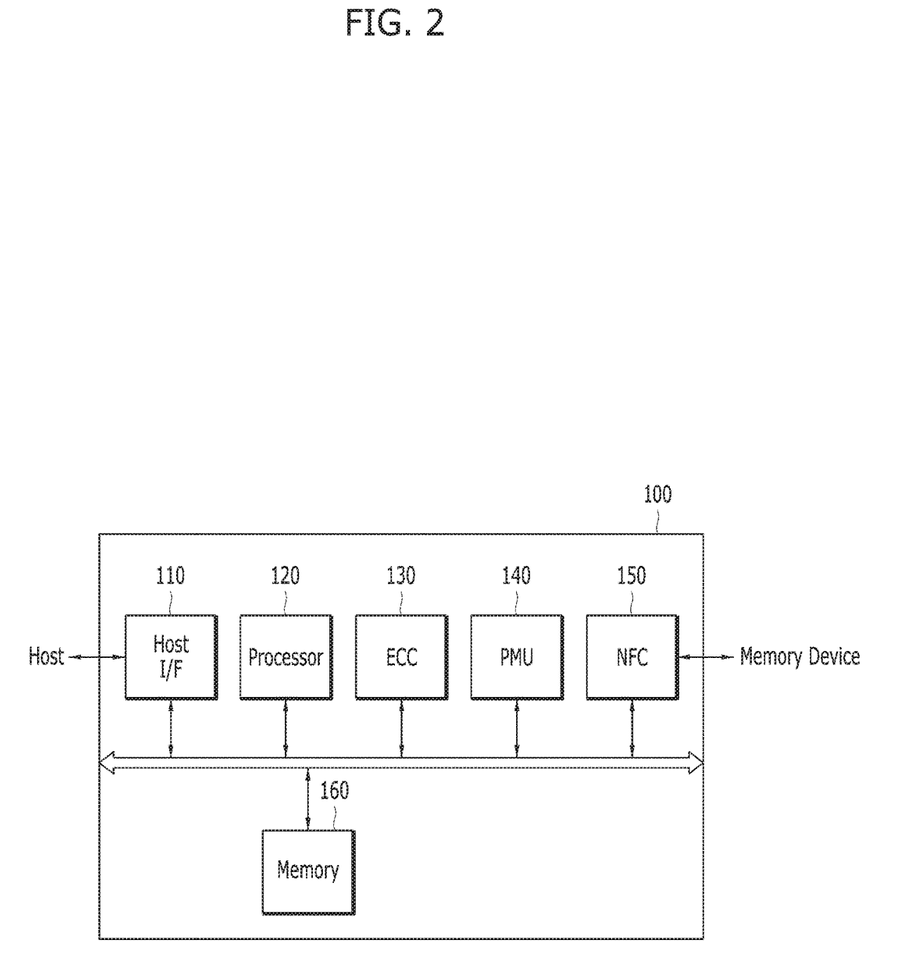
FIG. 2 is a simplified block diagram of a memory controller.

FIG. 2 illustrates an example of a memory controller. For example, FIG. 2 illustrates an exemplary configuration of the memory controller 100 illustrated in FIG. 1B.

Referring to FIG. 2, the memory controller 100 may include a host interface (I/F) circuit 110, a processor 120, an error correction code (ECC) circuit 130, a power management unit (PMU) 140, a memory interface (I/F) circuit 150 and a memory 160.

The host I/F circuit 110 may process a command and any related data received from the host 20. The host I/F circuit 110 may be configured to enable the memory controller 100 to communicate with the host 20 through one or more of various interface protocols.

The ECC circuit 130 may detect and correct an error contained in data which is accessed in a memory device. for example, the memory device may be the memory device 200 illustrated in FIG. 1B. The PMU 140 may provide electrical power to the various components included in the memory controller 100, and manage the electrical power provided to the components.

The memory I/F circuit 150 may perform interfacing between the memory controller 100 and the memory device 200. Specifically, the memory I/F circuit 150 may process a command and data between the memory controller 100 and the memory device 200, which is controlled by the processor 120. For example, the memory I/F circuit 150 may transfer a write data from the host 20 to the memory device 200 in response to a write command from the host 20, such that the write data are stored in the memory device 200. For another example, the memory I/F circuit 150 may receive a data outputted from the memory device 200 in response to a read command from the host 20, and may transfer the read data to the host 20.

The memory 160 may serve as a working memory of the memory system 35 and the memory controller 100 and store a program or data related to the operations of the memory system 35 and the memory controller 100. For example, the memory 160 may store a program data required for performing a write operation and/or a read operation at the memory device 200 by the host 20, and may store a write data and/or read a stored data. The memory 160 may be implemented with a volatile memory such as an SRAM or a DRAM.

The processor 120 may control the overall operations of the memory system 35. For example, the processor 120 may control a write operation and/or a read operation on the memory device 200 in response to a write request or a read request received from the host 20.

Figure 3:
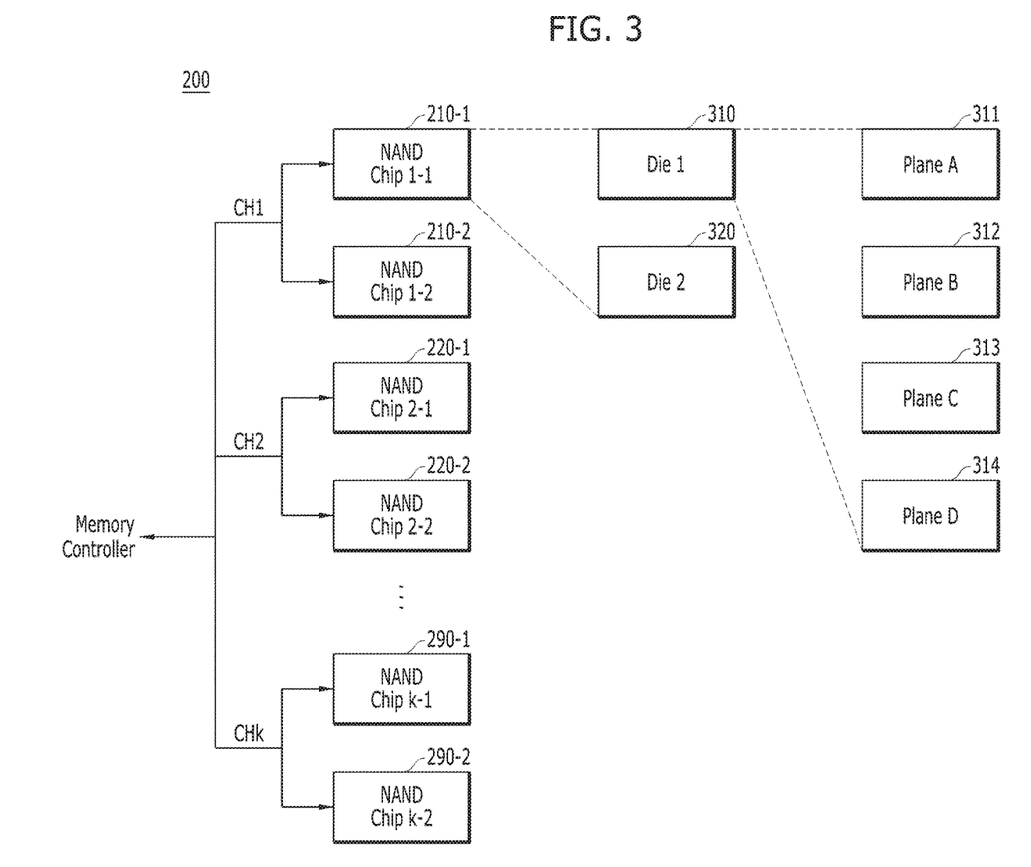
FIG. 3 a schematic diagram illustrating a hierarchical structure of a memory device.

FIG. 3 illustrates a hierarchical structure of a memory device. For example, FIG. 3 illustrates the configuration of a nonvolatile memory device such as a NAND-type flash memory which may serve as the memory device 200 illustrated in FIG. 1B.

Referring to FIG. 3, the memory device 200 may include a plurality of NAND chips 210-1 and 220-1, 220-1 and 220-2, . . . , 290-1 and 290-2. The plurality of NAND chips 210-1 and 220-1, 220-1 and 220-2, . . . , 290-1 and 290-2 may be coupled to a memory controller, for example, the memory controller 100 illustrated in FIG. 1B through a plurality of channels CH1, CH2, . . . , CHk (herein, k is a positive integer larger than 2). The NAND chips 210-1 and 210-2 may be coupled to the memory controller 100 through the channel CH1, the NAND chips 220-1 and 220-2 may be coupled to the memory controller 100 through the channel CH2, and the NAND chips 290-1 and 290-2 may be connected to the memory controller 100 through the channel CHk.

The NAND chip 210-1 may include a plurality of memory dies. For example, each NAND chip, e.g., the NAND chip 210-1 may include two memory dies 310 and 320, and each memory die, e.g., the memory die 310 may include a plurality of memory planes 311 to 314. Each of the memory planes may include a plurality of memory blocks (not illustrated), and each of the memory blocks may include a plurality of memory pages (not illustrated).

In another example, each memory die, e.g., the memory die 310 may include two memory planes. In an embodiment, the memory plane may include 1024 memory blocks, and each of the blocks may include 512 pages.

Figure 4:
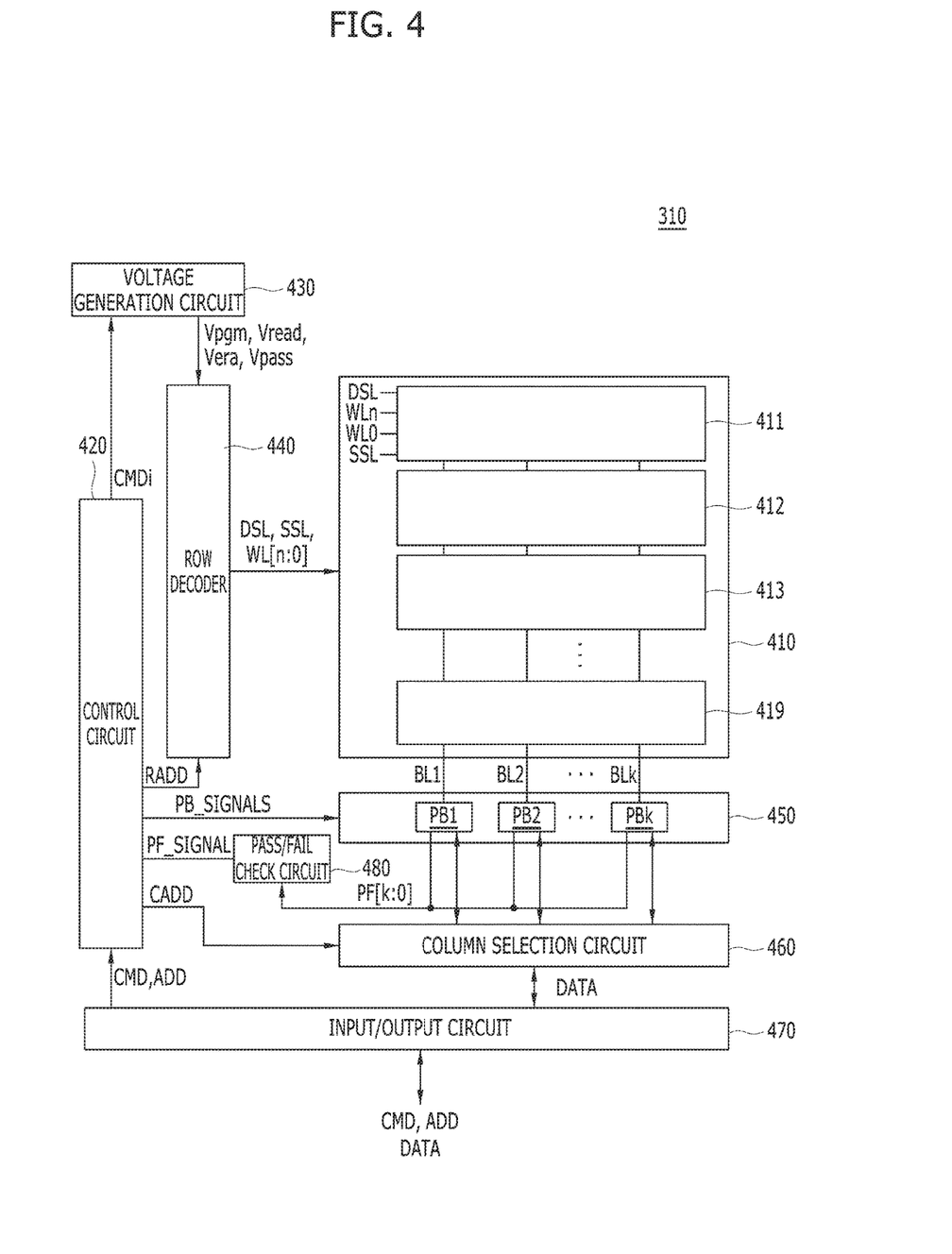
FIG. 4 is a simplified block diagram of a memory device die.
Figure 5:
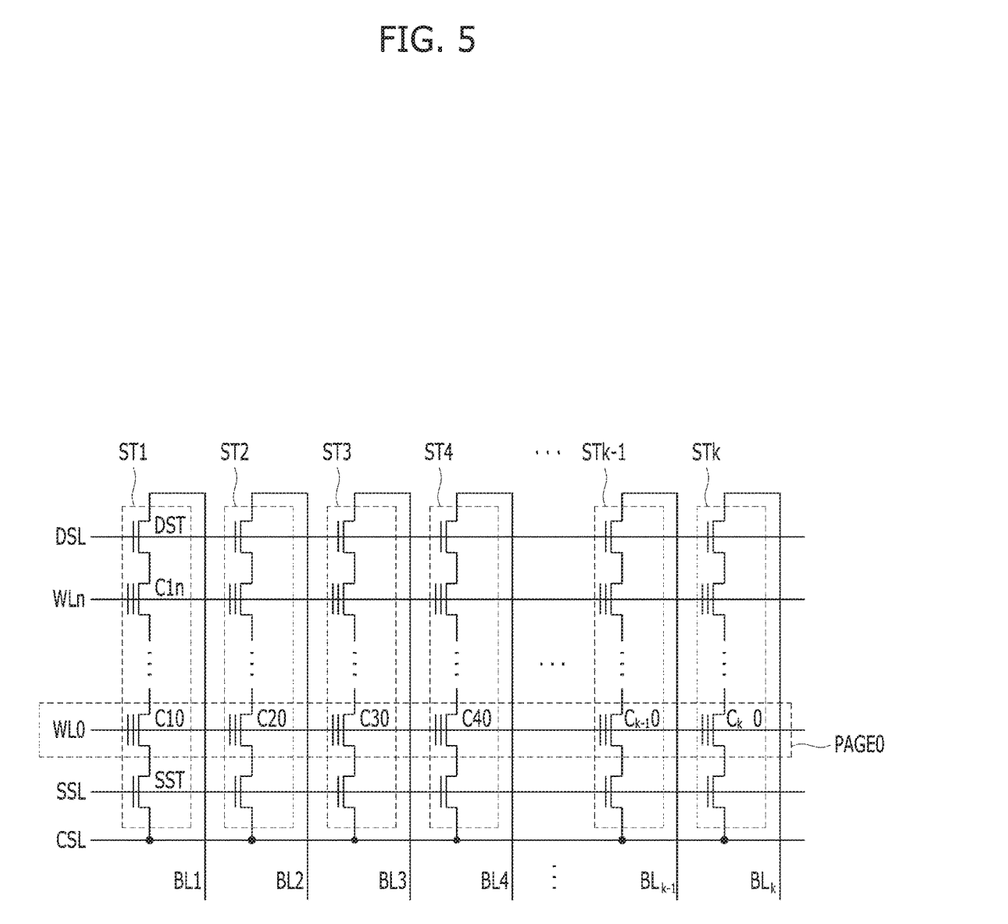
FIG. 5 is a circuit diagram illustrating a memory block.

FIG. 4 illustrates a simplified block diagram of a configuration of a memory die, and FIG. 5 illustrates a circuit diagram of memory block. For example, FIG. 4 illustrates an exemplary configuration of the memory die 310 illustrated in FIG. 3.

Referring to FIG. 4, the memory die 310 may include a memory cell array 410 including a plurality of memory blocks 411 to 419, a voltage generation circuit 430, a row decoder 440, a page buffer group 450, a column selection circuit 460, an input/output circuit 470, a pass/fail check circuit 480 and a control circuit 420. The voltage generation circuit 430, the row decoder 440, the page buffer group 450, the column selection circuit 460, the input/output circuit 470 and the pass/fail check circuit 480 may be configured to perform a program operation, a read operation and a test operation on memory cells included in a page selected from the memory blocks 411 to 419, and the control circuit 420 may control the circuit elements 430 to 480.

In a NAND flash memory device, operation circuits may include the voltage generation circuit 430 serving as a voltage supply circuit, the row decoder 440, the page buffer group 450, the column selection circuit 460, the input/output circuit 470 and the pass/fail check circuit 480. The memory cell array 410 may include a plurality of memory blocks 411 to 419.

FIG. 4 illustrates that the memory die 310 includes components within a single plane. However, the memory die 310 may include components arranged in each of a plurality of planes. For example, when the memory die 310 includes two planes, the memory die 310 may include two voltage generation circuits, two row decoders, two page buffer groups, two column selection circuits, two input/output circuits and two pass/fail check circuits.

Referring to FIG. 5, the memory block may include a plurality of strings ST1 to STk coupled between the bit lines BL1 to BLk and a common source line CSL (herein, k is a positive integer larger than 4). That is, the strings ST1 to STk may be coupled to the corresponding bit lines BL1 to BLk, and coupled to the common source line CSL in common. The string ST1 may include a source select transistor SST having a source coupled to the common source line CSL, a plurality of memory cells C10 to C1n, and a drain select transistor DST having a drain coupled to the bit line BL1. The memory cells C10 to C1n may be coupled in series between the source select transistor SST and the drain select transistor DST. The gate of the source select transistor SST may be coupled to a source select line SSL, the gates of the memory cells C10 to C1n may be coupled to word lines WL0 to WLn, respectively, and the gate of the drain select transistor DST may be coupled to a drain select line DSL.

In a NAND flash memory device, memory cells included in a memory block may be divided by a physical page or a logical page. For example, the memory cells C10 to Ck0 coupled to a single word line WL0 may constitute a single physical page PAGE0. Even-numbered memory cells Ce10 to Cek0 coupled to a single word line WL0 may constitute a single even physical page, and odd-numbered memory cells Co10 to Cok0 may constitute a single odd physical page. Such a page may be set to the basic unit of a program or a read operation. In this example, the case where memory cells coupled to a single word line constitute a single physical page will be taken as an example for description.

Referring back to FIGS. 4 to 5, the control circuit 420 may output an internal command signal CMDi for performing a program operation, a read operation or a test operation in response to a command signal CMD, entered from an external device, through the input/output circuit 470, and may output PB control signals PB_SIGNALS for controlling plural page buffers PB1 to PBk included in the page buffer group 450 depending on the type of an operation. Furthermore, the control circuit 420 may output a row address signal RADD and a column address signal CADD in response to an address signal ADD inputted from an external through the input/output circuit 470.

The voltage generation circuit 430 and the row decoder 440 which serve as a voltage supply circuit may supply plural operation voltages, used for memory cells, to a selected memory cell block in response to the internal command signal CMDi from the control circuit 420. The voltage generation circuit 430 may output the operation voltages (for example, Vpgm, Vread, Vpass), required for program, read and test operations in the memory cells, to plural global lines in response to the internal command signal CMDi from the control circuit 420. For the program operation, the voltage generation circuit 430 may output the program voltage Vpgm and the pass voltage Vpass to the plural global lines, such that the program voltage Vpgm is applied to memory cells of a selected page while the pass voltage Vpass is applied to unselected memory cells. For the read operation, the voltage generation circuit 430 may output the read voltage Vread and the pass voltage Vpass to the global lines, such that the program voltage Vread is applied to memory cells of a selected page while the pass voltage Vpass is applied to unselected memory cells. During the test operation related to data stored, the voltage generation circuit 430 may output the program voltage Vpgm and the pass voltage Vpass as in the program operation. During the test operation related to data read, the voltage generation circuit 430 may output the read voltage Vread and the pass voltage Vpass as in the read operation.

The row decoder 440 may couple the global lines to the local lines DSL, WL0 to WLn and SSL in response to the row address signals RADD from the control circuit 420, such that the operation voltages outputted to the global lines from the voltage generation circuit 430 can be transferred to the local lines DSL, WL0 to WLn and SSL of the memory blocks 411 to 419 selected from the memory cell array 410. Therefore, the program voltage Vpgm or the read voltage Vread may be applied to a local word line (for example, WL0) coupled to a selected cell (for example, C01) from the voltage generation circuit 430 through a global word line. On the other hand, the pass voltage Vpass may be applied to the local word lines (for example, WL1 to WLn) coupled to the unselected cells C11 to Cn1 from the voltage generation circuit 430 through the global word lines. During an erase operation, an erase voltage Vera may be applied to the whole memory cells in a block. Therefore, data may be stored in the selected cell C01 by the program voltage Vpgm, or data stored in the selected cell C01 may be read by the read voltage Vread.

The page buffer group 450 may include the plurality of page buffers PB1 to PBk coupled to the memory cell array 410 through the bit lines BL1 to BLk. In response to the PB control signal PB_SIGNALS from the control circuit 420, the page buffers PB1 to PBk of the page buffer group 450 may selectively precharge the bit lines BL1 to BLk depending on input data in order to store the data in the memory cells C10 to Ck0, or sense the voltages of the bit lines BL1 to BLk in order to read data from the memory cells C10 to Ck0.

For example, when program data (for example, data) '0') is inputted to the page buffer PB1 to store the program data in the memory cell C01, the page buffer PB1 may apply a program permission voltage (for example, ground voltage) to the bit line BL1 of the memory cell C01 in which the program data is to be stored, during a program operation. As a result, the threshold voltage of the memory cell C01 may be raised by the program voltage Vpgm applied to the word line WL0 and the program permission voltage applied to the bit line BL1 during the program operation. Furthermore, when erase data (for example, data '1') is inputted to the page buffer PB1 in order to store the erase data in the memory cell C01, the page buffer PB1 may apply a program inhibition voltage (for example, supply voltage) to the bit line BL1 of the memory cell C01 in which the erase data is to be stored, during a program operation. As a result, although the program voltage Vpgm is applied to the word line WL0 during the program operation, a rise of the threshold voltage of the memory cell C01 may be inhibited by the program inhibition voltage applied to the bit line BL1. As the memory cell has different threshold voltages, different data may be stored in the memory cell.

During a read operation, the page buffer group 450 may precharge all the selected bit lines (for example, BL1 to BLk). When the read voltage Vread is applied to the selected word line WL0 from the voltage generation circuit 430 and the row decoder 440, the bit lines of memory cells having program data stored therein may maintain the precharged state, and the bit lines of memory cells having erase data stored therein may be discharged. The page buffer group 450 may sense the voltage changes of the bit lines BL1 to BLk and may latch the data of the memory cells corresponding to the sensing result.

The column selection circuit 460 may select the page buffers PB1 to PBk included in the page buffer group 450 in response to a column address signal CADD outputted from the control circuit 420. That is, the column selection circuit 460 may sequentially transfer data to the page buffers PB1 to PBk in response to the column address signal CADD, for storing the data in memory cells. Furthermore, the column selection circuit 460 may sequentially select the page buffers PB1 to PBk in response to the column address signal CADD, such that data of memory cells, latched in the page buffers PB1 to PBk, can be outputted to the outside through a read operation.

The input/output circuit 470 may transfer data to the column selection circuit 460 according to control of the control circuit 420, for inputting the data to the page buffer group 450, the data being inputted from an external device so as to be stored in memory cells during a program operation. When the column selection circuit 460 transfers the data from the input/output circuit 470 to the page buffers PB1 to PBk of the page buffer group 450 according to the above-described method, the page buffers PB1 to PBk may store the data in latch circuits thereof. Furthermore, during a read operation, the input/output circuit 470 may output data to the outside, the data being transferred through the column selection circuit 460 from the page buffers PB1 to PBk of the page buffer group 450.

The pass/fail check circuit 480 may output a pass/fail signal PF_SIGNAL in response to comparison result signals PF[1] to PF[k] outputted from the respective page buffers PB1 to PBk during a program verification operation which is performed after the program operation. Specifically, during the program verification operation, the pass/fail check circuit 480 may compare the threshold voltages of memory cells to a target voltage, and may latch the result values in the internal latch circuits of the page buffers PB1 to PBk. The latched comparison result signals PF[1] to PF[k] may be outputted to the pass/fail check circuit 480. The pass/fail check circuit 480 may output the pass/fail signal PF_SIGNAL to the control circuit 420 in response to the comparison result signals PF[1] to PF[k], the pass/fail signal PF_SIGNAL indicating whether the program operation has been completed. The control circuit 420 may determine whether there is a memory cell of which the threshold voltage is lower than the target voltage, among the memory cells having program data stored therein, in response to the pass/fail signal PF_SIGNAL. According to the determination result, the control circuit 420 may decide whether to perform the program operation again.

The control circuit 420 may control the memory die 310 in response to a read command, such that a read operation can be performed on the plurality of memory planes included in the memory die 310 at different speeds or different timings. For example, when the memory die 310 includes memory cells of first and second planes, the control circuit 420 may perform multiple read operations in response to the read command. The multiple read operations may include a first read operation performed on the memory cells of the first plane in a first read period and a second read operation performed on the memory cells of the second plane in a second read period.

In various examples, the memory planes may be set to single level cells (SLCs) including different numbers of memory blocks.

In various examples, the control circuit 420 may control the voltage generation circuit 430 to generate an operation voltage, a read voltage and a pass voltage for a read operation. In other words, the control circuit 420 may control the voltage generation circuit 430 to apply the operation voltage to the drain select line, to apply the read voltage to a word line selected for the read operation, and to apply the pass voltage to an unselected word line. Furthermore, the control circuit 420 may precharge a selected bit line.

In various examples, each of the first and second read operations may include first to third sub-operations. The first sub-operation may include an operation of applying the operation voltage to the drain select line, the second sub-operation may include an operation of applying the read voltage to the selected word line and applying the pass voltage to the unselected word line, and the third sub-operation may include an operation of precharging the selected bit line.

In the various examples, the start timings of beginning the first and second sub-operations may be equal to each other or different from each other, and the start timings of beginning the second and third sub-operations may be equal to each other or different from each other.

Figure 6A:
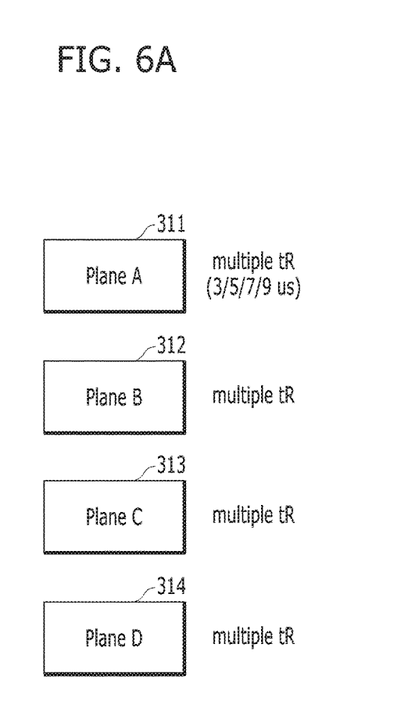
FIGS. 6A and 6B are exemplary diagrams illustrating multiple read operations performed on a plurality of planes in accordance with an embodiment of the invention.
Figure 6B:
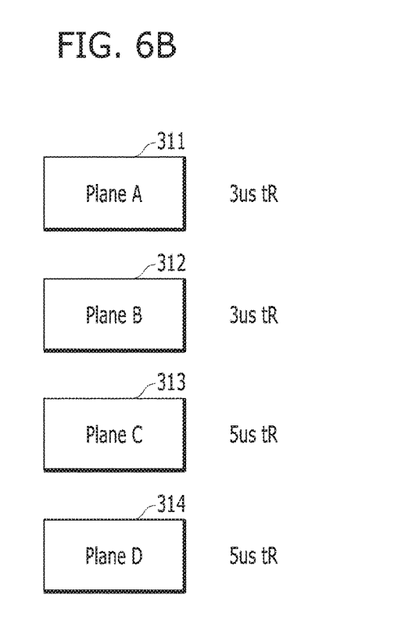

FIGS. 6A and 6B illustrate multiple read operations which are performed on a plurality of planes in accordance with embodiments.

Referring to FIG. 6A, the memory device may include a plurality of memory planes (or cells of planes) 311 to 314. The plurality of memory planes 311 to 314 may support multiple read operations at various read speeds or read timings. For example, the plurality of memory planes 311 to 314 may support a read operation at a first speed of 3 µs, a read operation at a second speed of 5 µs, a read operation at a third speed of 7 µs, and a read operation at a fourth speed of 9 µs.

Referring to FIG. 6B, the plurality of memory planes 311 to 314 may perform read operations at different speeds under control of the control circuit 420 illustrated in FIG. 4. The memory planes including different numbers of memory blocks may perform read operations at different read speeds or read timings. For example, the memory plane A 311 may perform a read operation at a first read speed of 3 µs tR, the memory plane B 312 may perform a read operation at the first read speed of 3 µs is tR, the memory plane C 313 may perform a read operation at a second read speed of 5 µs tR, and the memory plane D 314 may perform a read operation at the second read speed of 5 µs tR. At this time, the memory plane A 311 and the memory plane B 312 may include an equal number of memory blocks, and the memory plane C 313 and the memory plane D 314 may include an equal number of memory blocks.

FIGS. 7A to 7D illustrate the timings of multiple read operations which are performed on a plurality of planes in accordance with the embodiments. The multiple read operations of FIGS. 7A to 7D may be controlled by the control circuit 420, the voltage generation circuit 430, the row decoder 440, the page buffer group 450 and the column selection circuit 460 which are illustrated in FIG. 4.

Figure 7A:
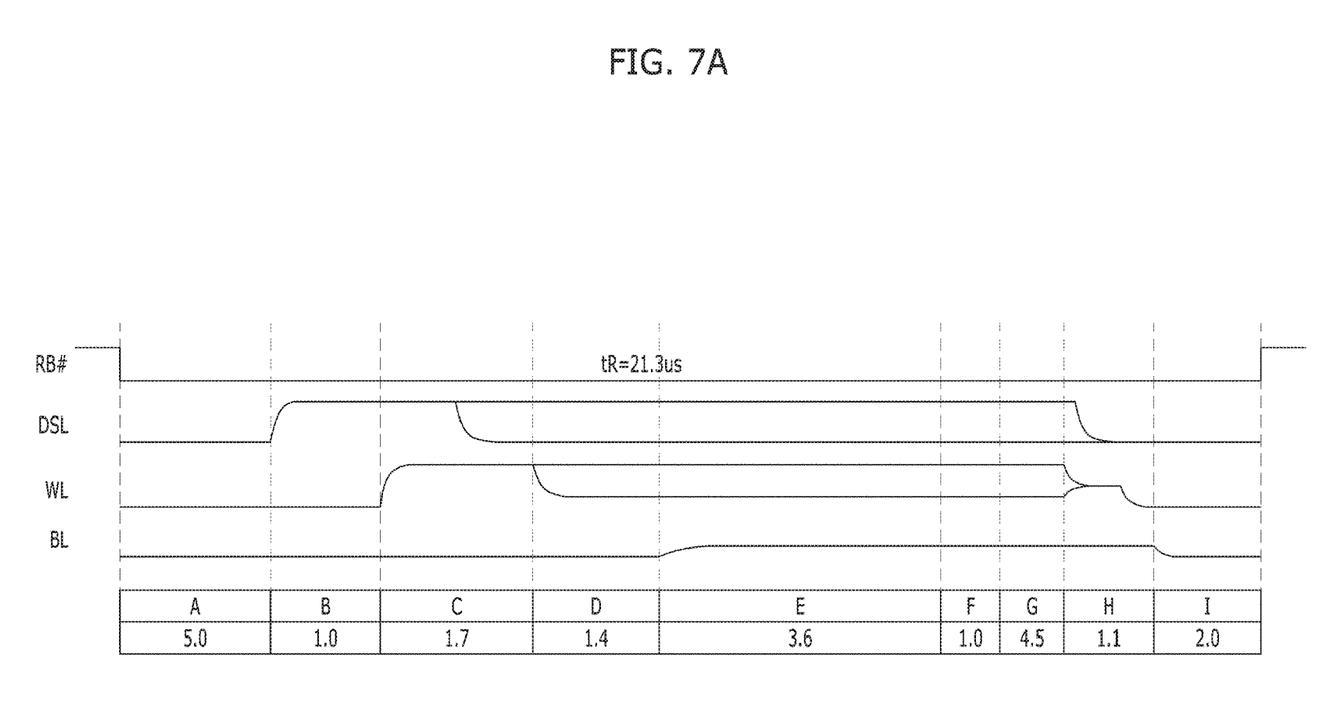
FIGS. 7A to 7D are timing diagrams illustrating the multiple read operations performed on the plurality of planes in accordance with an embodiment of the invention.

Referring to FIG. 7A, the read operations may be performed during a read period in which a ready/busy signal RB# is at a low level. The read period may correspond to the sum of a period A of 5.0 µs, a period B of 1.0 µs, a period C of 1.7 µs, a period D of 1.4 µs, a period E of 3.6 µs, a period F of 1.0 µs, a period G of 4.5 µs, a period H of 1.1 µs and a period I of 2.0 µs, for example. That is, the read operation may be performed at a read speed (tR=21.3 µs, for example).

The read period may include a first period in which the operation voltage is applied to the drain select line DSL, a second period in which the read voltage Vread is applied to a selected word line WL and the pass voltage Vpass is applied to an unselected word line, and a third period in which a selected bit line BL is precharged.

The first period may correspond to the sum of the period B of 1.0 µs, the period C of 1.7 µs, the period D of 1.4 µs, the period E of 3.6 µs, the period F of 1.0 µs, the period G of 4.5 µs and the period H of 1.1 µs, for example. The second period may correspond to the sum of the period C of 1.7 µs, the period D of 1.4 µs, the period E of 3.6 µs, the period F of 1.0 µs, the period G of 4.5 µs and the period H of 1.1 µs, for example. The third period may correspond to the sum of the period D of 1.4 µs, the period E of 3.6 µs, the period F of 1.0 µs, the period G of 4.5 µs and the period H of 1.1 µs, for example.

In various examples, the start timings of starting the first and second periods may be different from each other, and the start timings of starting the second and third periods may be different from each other.

Figure 7B:
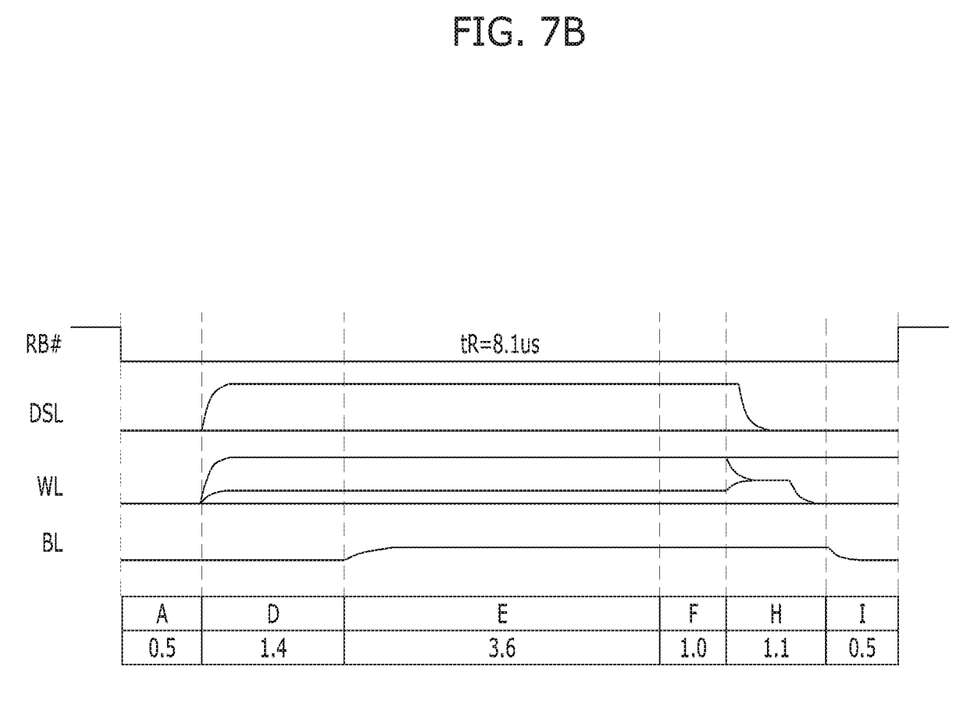

Referring to FIG. 7B, the read operations may be performed in a read period in which the ready/busy signal RB# is at a low level. The read period may correspond to the sum of the period A of 0.5 µs, the period D of 1.4 µs the period E of 3.6 µs, the period F of 1.0 µs, the period H of 1.1 µs and the period I of 0.5 µs, for example. That is, the read operation may be performed at a read speed (tR=8.1 µs, for example).

The read period may include the first period in which the operation voltage is applied to the drain select line DSL, the second period in which the read voltage Vread is applied to a selected word line WL and the pass voltage Vpass is applied to an unselected word line, and the third period in which a selected bit line BL is precharged.

the first period may correspond to the sum of the period D of 1.4 µs, the period E of 3.6 µs, the period F of 1.0 µs and the period H of 1.1 µs. The second period may correspond to the sum of the period D of 1.4 µs, the period E of 3.6 µs, the period F of 1.0 µs and the period H of 1.1 µs, for example. The third period may correspond to the sum of the period E of 3.6 µs, the period F of 1.0 µs and the period H of 1.1 µs, for example.

In various examples, the start timings of starting the first and second periods may be equal to each other, and the start timings of starting the second and third periods may be different from each other.

Figure 7C:
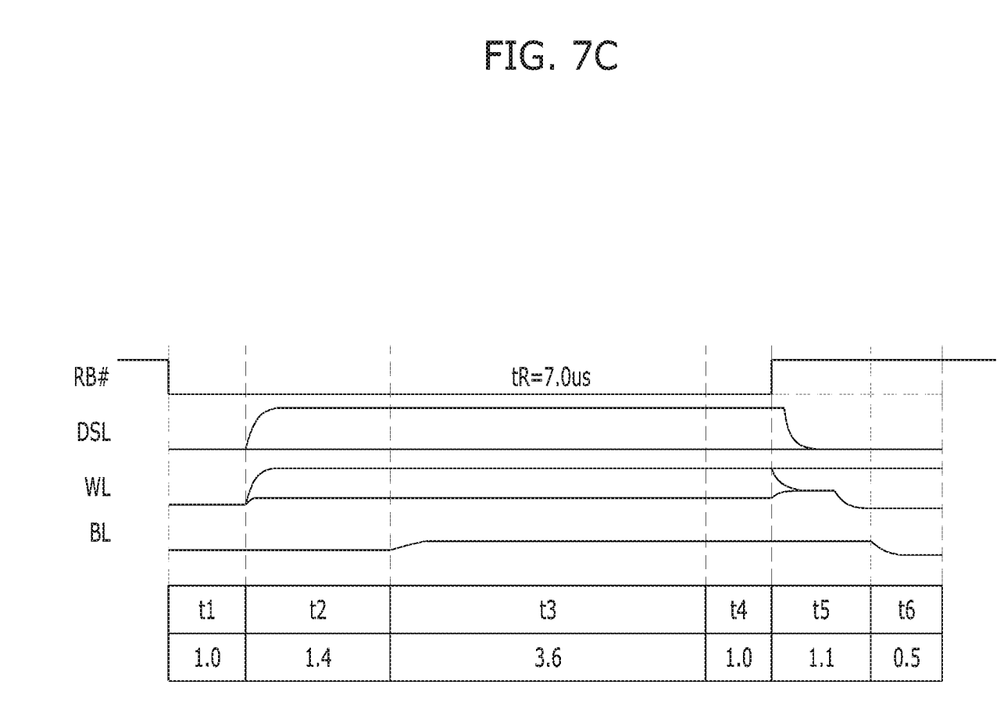

Referring to FIG. 7C, the read operations may be performed in a read period in which the ready/busy signal RB# is at a low level. For example, the read period may correspond to the sum of a period t1 of 1.0 µs, a period t2 of 1.4 µs, a period t3 of 3.6 µs, a period t4 of 1.0 µs, a period t5 of 1.1 µs and a period t6 of 0.5 µs. For another example, the read period may correspond to the sum of the period t1 of 1.0 µs, the period t2 of 1.4 µs, the period t3 of 3.6 µs and the period t4 of 1.0 µs. In this case, the read operations may be performed at a read speed (tR=7.0 µs, for example), while operations other than a data output operation may be inhibited during {t5+t6} after a rise of the ready/busy signal RB#.

The read period may include the first period in which the operation voltage is applied to the drain select line DSL, the second period in which the read voltage Vread is applied to a selected word line WL and the pass voltage Vpass is applied to an unselected word line, and the third period in which a selected bit line BL is precharged.

The first period may correspond to the sum of the period t2 of 1.4 µs, the period t3 of 3.6 µs, the period t4 of 1.0 µs and the period t5 of 1.1 µs. The second period may correspond to the sum of the period t2 of 1.4 µs, the period t3 of 3.6 µs, the period t4 of 1.0 µs and the period t5 of 1.1 µs, for example. The third period may correspond to the sum of the period t3 of 3.6 µs, the period t4 of 1.0 µs and the period t5 of 1.1 µs, for example.

In various examples, the start timings of starting the first and second periods may be equal to each other, and the start timings of starting the second and third periods may be different from each other.

Figure 7D:
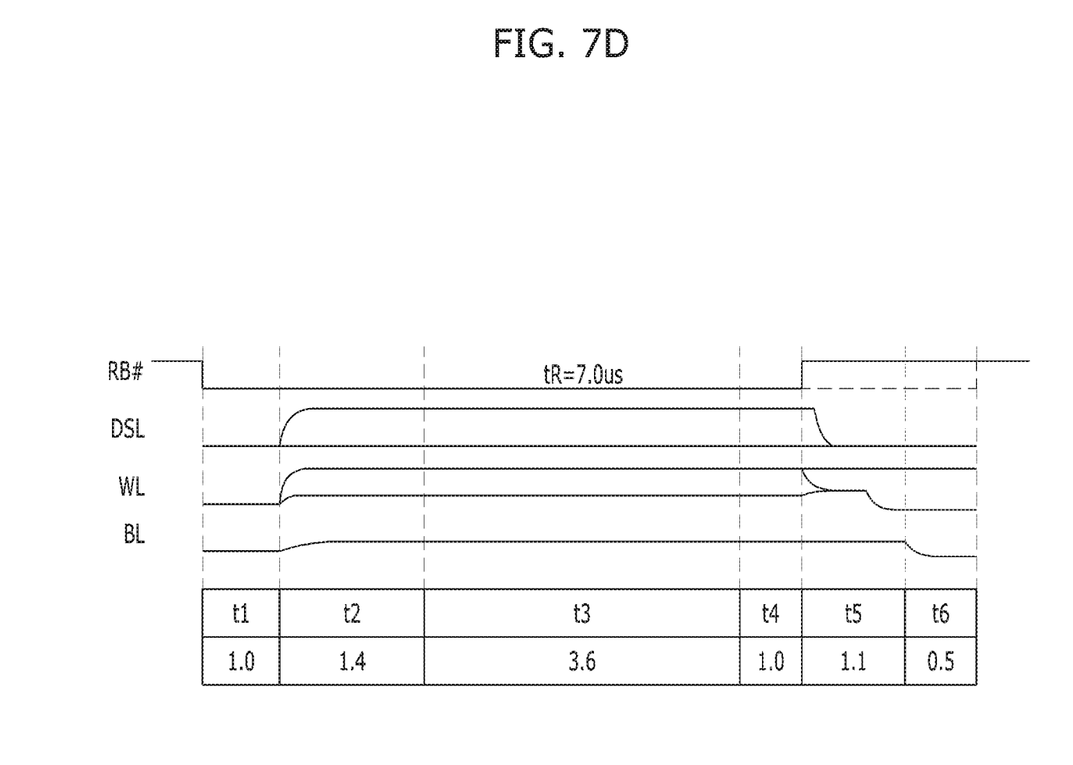

Referring to FIG. 7D, the read operations may be performed in a read period in which the ready/busy signal RB# is at a low level. For example, the read period may correspond to the sum of a period t1 of 1.0 µs, a period t2 of 1.4 µs, a period t3 of 3.6 µs, a period t4 of 1.0 µs, a period t5 of 1.1 µs and a period t6 of 0.5 µs. For another example, the read period may correspond to the sum of the period t1 of 1.0 µs, the period t2 of 1.4 µs, the period t3 of 3.6 µs and the period t4 of 1.0 µs. In this case, the read operation may be performed at a read speed (tR=7.0 µs, for example), while operations other than a data output operation may be inhibited during {t5+t6} after a rise of the ready/busy signal RB#.

The read period may include the first period in which the operation voltage is applied to the drain select line DSL, the second period in which the read voltage Vread is applied to a selected word line WL and the pass voltage Vpass is applied to an unselected word line, and the third period in which a selected bit line BL is precharged.

The first period may correspond to the sum of the period t2 of 1.4 µs, the period t3 of 3.6 µs, the period t4 of 1.0 µs and the period t5 of 1.11 µs. The second period may correspond to the sum of the period t2 of 1.4 µs, the period t3 of 3.61 µs, the period t4 of 1.0 µs and the period t5 of 1.1 µs, for example. The third period may correspond to the sum of the period t3 of 3.6 µs, the period t4 of 1.0 µs and the period t5 of 1.1 µs, for example.

In various examples, the start timings of starting the first and second periods may be equal to each other, and the timings of starting the second and third periods may be equal to each other.

In accordance with the embodiments, the memory device can support the memory planes with multiple read operations performed in different read speeds, and the memory planes having plural blocks can perform read operations at different speeds on different blocks.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
   at least one first memory cell of first plane;
   at least one second memory cell of second plane; and
   a control circuit suitable for performing multiple read operations on the at least one first memory cell and the at least one second memory cell in response to a read command,
   wherein the multiple read operations comprise a first read operation, which is performed on the at least one first memory cell in a first read period, and a second read operation which is performed on the at least second memory cell in a second read period, and
   wherein each of the first and second read periods comprises a first period in which an operation voltage is applied to a drain select line, a second period in which a read voltage is applied to a word line selected for the first and second read operations and a pass voltage is applied to a unselected word line, and a third period in which a selected bit line is precharged.

2. The memory device of claim 1, wherein the first and second planes comprise different numbers of memory blocks.

3. The memory device of claim 1, wherein the first and second planes comprise single level cells (SLCs).

4. The memory device of claim 1, further comprising a voltage generation circuit suitable for generating the operation voltage, the read voltage and the pass voltage for the first and second read operations.

5. The memory device of claim 4, wherein the control circuit controls the voltage generation circuit to apply the operation voltage to the drain select line, to apply the read voltage to the selected word line, and to apply the pass voltage to the unselected word line, and precharges the selected bit line.

6. The memory device of claim 1, wherein the first and second periods have the same start timing.

7. The memory device of claim 1, wherein the first and second periods have different start timings.

8. The memory device of claim 1, wherein the second and third periods have the same start timing.

9. The memory device of claim 1, wherein the second and third periods have different start timings.

10. A memory device comprising:
a plurality of memory planes; and
a control circuit suitable for controlling plural read operations to be performed on different memory planes in different timings in response to a read command,
wherein each of the plural read operations comprises a first operation of applying an operation voltage to a drain select line, a second operation of applying a read voltage to a word line selected for the plural read operations and applying a pass voltage to a unselected word line, and a third operation of precharging a selected bit line.

11. The memory device of claim 10, wherein the plurality of planes comprises different numbers of memory blocks, respectively.

12. The memory device of claim 10, wherein each of the memory planes comprises single level cells (SLCs).

13. The memory device of claim 10, further comprising a voltage generation circuit suitable for generating the operation voltage, the read voltage and the pass voltage for the plural read operations.

14. The memory device of claim 13, wherein the control circuit controls the voltage generation circuit to apply the operation voltage to the drain select line, to apply the read voltage to the selected word line, and to apply the pass voltage to the unselected word line, and precharges the selected bit line.

15. The memory device of claim 10, wherein the first and second operations have the same start timing.

16. The memory device of claim 10, wherein the first and second operations have different start timings.

17. The memory device of claim 10, wherein the second and third operations have the same start timing.

18. The memory device of claim 10, wherein the second and third operations have different start timings.

19. A memory device comprising:
a plurality of memory planes, each having different number of memory blocks; and
a control circuit suitable for controlling plural read operations to be performed on different memory planes in different timings, depending on the number of memory block, in response to a read command,
wherein each of the plural read operations comprises a first operation of applying an operation voltage to a drain select line, a second operation of applying a read voltage to a word line selected for the plural read operations and applying a pass voltage to a unselected word line, and a third operation of precharging a selected bit line.

* * * * *